(12) United States Patent
Onogi et al.

(10) Patent No.: US 12,356,704 B2
(45) Date of Patent: Jul. 8, 2025

(54) FIELD EFFECT TRANSISTOR WITH CONTACT VIA STRUCTURES THAT ARE LATERALLY SPACED BY A SUB-LITHOGRAPHIC DISTANCE AND METHOD OF MAKING THE SAME

(71) Applicant: SANDISK TECHNOLOGIES LLC, Addison, TX (US)

(72) Inventors: Kouta Onogi, Yokkaichi (JP); Kazutaka Yoshizawa, Yokkaichi (JP); Hokuto Kodate, Yokkaichi (JP); Mitsuhiro Togo, Yokkaichi (JP); Takahito Fujita, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 383 days.

(21) Appl. No.: 17/821,273

(22) Filed: Aug. 22, 2022

(65) Prior Publication Data
US 2024/0063062 A1    Feb. 22, 2024

(51) Int. Cl.
*H10D 84/03* (2025.01)
*H01L 21/265* (2006.01)
(Continued)

(52) U.S. Cl.
CPC ..... *H10D 84/038* (2025.01); *H01L 21/26513* (2013.01); *H01L 21/266* (2013.01);
(Continued)

(58) Field of Classification Search
CPC .... H10D 84/038; H10D 64/62; H10D 64/663; H10D 84/0133; H10D 84/0137;
(Continued)

(56) References Cited

U.S. PATENT DOCUMENTS 6,897,520 B2   5/2005  Vora
6,963,094 B2   11/2005 Lee et al.
(Continued)

OTHER PUBLICATIONS

U.S. Appl. No. 17/188,271, filed Mar. 1, 2021, SanDisk Technologies LLC.
(Continued)

*Primary Examiner* — Eva Y Montalvo
*Assistant Examiner* — Nicholas B Michaud
(74) *Attorney, Agent, or Firm* — THE MARBURY LAW GROUP PLLC

(57) ABSTRACT

A transistor includes a first active region and a second active region separated by a semiconductor channel, a gate stack structure including a gate dielectric and a gate electrode overlying the semiconductor channel, a gate contact via structure overlying and electrically connected to the gate electrode and having a top surface located in a first horizontal plane, a first active-region contact via structure overlying and electrically connected to the first active region, and having a top surface located within a second horizontal plane that underlies the first horizontal plane, a first connection line structure contacting a top surface of the first active-region contact via structure, and a first connection via structure contacting a top surface of the first connection line structure and having a top surface within the first horizontal plane.

2 Claims, 11 Drawing Sheets

(51) Int. Cl.
  *H01L 21/266* (2006.01)
  *H01L 21/28* (2025.01)
  *H01L 21/285* (2006.01)
  *H01L 21/768* (2006.01)
  *H01L 23/535* (2006.01)
  *H10D 64/62* (2025.01)
  *H10D 64/66* (2025.01)
  *H10D 84/01* (2025.01)
  *H10D 84/83* (2025.01)

(52) U.S. Cl.
  CPC .. *H01L 21/28052* (2013.01); *H01L 21/28518* (2013.01); *H01L 21/76805* (2013.01); *H01L 21/76895* (2013.01); *H01L 23/535* (2013.01); *H10D 64/62* (2025.01); *H10D 64/663* (2025.01); *H10D 84/0133* (2025.01); *H10D 84/0137* (2025.01); *H10D 84/0149* (2025.01); *H10D 84/83* (2025.01)

(58) Field of Classification Search
  CPC ............... H10D 84/0149; H10D 84/83; H01L 21/26513; H01L 21/266; H01L 21/28052; H01L 21/28518; H01L 21/76805; H01L 21/76895; H01L 23/535
  USPC .......................................................... 257/384
  See application file for complete search history.

(56) References Cited

U.S. PATENT DOCUMENTS

| | | | |
|---|---|---|---|
| 7,026,199 | B2 | 4/2006 | Lee |
| 7,700,952 | B2 | 4/2010 | Park et al. |
| 8,017,950 | B2 | 9/2011 | Joo |
| 8,847,246 | B2 | 9/2014 | Ryu et al. |
| 8,969,963 | B2 | 3/2015 | Basker et al. |
| 10,115,735 | B2 | 10/2018 | Amano et al. |
| 10,224,407 | B2 | 3/2019 | Chowdhury et al. |
| 10,256,099 | B1 | 4/2019 | Akaiwa et al. |
| 10,355,017 | B1 | 7/2019 | Nakatsuji et al. |
| 10,355,100 | B1 | 7/2019 | Ueda et al. |
| 10,910,020 | B1 | 2/2021 | Kodate et al. |
| 11,004,974 | B1 | 5/2021 | Takimoto |
| 11,183,571 | B2 | 11/2021 | Huang et al. |
| 11,296,113 | B2 | 4/2022 | Kim et al. |
| 11,309,402 | B2 | 4/2022 | Amano et al. |
| 2003/0003651 | A1 | 1/2003 | Divakaruni et al. |
| 2004/0021179 | A1 | 2/2004 | Lee et al. |
| 2004/0099957 | A1 | 5/2004 | Jin |
| 2005/0095793 | A1 | 5/2005 | Lee |
| 2005/0106882 | A1* | 5/2005 | Chao ................. H01L 21/31144 438/700 |
| 2007/0236624 | A1 | 10/2007 | Park et al. |
| 2008/0142885 | A1* | 6/2008 | Mineji ............. H01L 21/26513 257/E21.336 |
| 2009/0321837 | A1* | 12/2009 | Wei .................. H01L 21/76816 257/E21.585 |
| 2011/0291119 | A1 | 12/2011 | Ryu et al. |
| 2015/0171151 | A1 | 6/2015 | Chae |
| 2016/0351709 | A1 | 12/2016 | Nishikawa et al. |
| 2018/0247954 | A1 | 8/2018 | Amano et al. |
| 2018/0248013 | A1 | 8/2018 | Chowdhury et al. |
| 2018/0331118 | A1 | 11/2018 | Amano |
| 2019/0296012 | A1 | 9/2019 | Iwata et al. |
| 2019/0355672 | A1* | 11/2019 | Fujita ................. H01L 23/5226 |
| 2021/0226027 | A1 | 7/2021 | Huang et al. |
| 2021/0391351 | A1 | 12/2021 | Takimoto |
| 2022/0068903 | A1 | 3/2022 | Kim et al. |
| 2022/0109054 | A1 | 4/2022 | Togo |
| 2022/0109070 | A1 | 4/2022 | Ono et al. |
| 2022/0109071 | A1 | 4/2022 | Togo |
| 2022/0122970 | A1 | 4/2022 | Do et al. |

OTHER PUBLICATIONS

U.S. Appl. No. 17/316,015, filed May 10, 2021, SanDisk Technologies LLC.
U.S. Appl. No. 17/316,079, filed May 10, 2021, SanDisk Technologies LLC.
U.S. Appl. No. 17/348,305, filed Jun. 15, 2021, SanDisk Technologies LLC.
U.S. Appl. No. 17/348,328, filed Jun. 15, 2021, SanDisk Technologies LLC.
U.S. Appl. No. 17/362,121, filed Jun. 29, 2021, SanDisk Technologies LLC.
U.S. Appl. No. 17/474,699, filed Sep. 14, 2021, SanDisk Technologies LLC.
U.S. Appl. No. 17/474,760, filed Sep. 14, 2021, SanDisk Technologies LLC.
U.S. Appl. No. 17/496,099, filed Oct. 7, 2021, SanDisk Technologies LLC.
U.S. Appl. No. 17/496,122, filed Oct. 7, 2021, SanDisk Technologies LLC.
U.S. Appl. No. 17/501,163, filed Oct. 14, 2021, SanDisk Technologies LLC.
U.S. Appl. No. 17/529,802, filed Nov. 18, 2021, SanDisk Technologies LLC.
U.S. Appl. No. 17/562,635, filed Dec. 27, 2021, SanDisk Technologies LLC.
U.S. Appl. No. 17/562,888, filed Dec. 27, 2021, SanDisk Technologies LLC.

* cited by examiner

FIELD EFFECT TRANSISTOR WITH CONTACT VIA STRUCTURES THAT ARE LATERALLY SPACED BY A SUB-LITHOGRAPHIC DISTANCE AND METHOD OF MAKING THE SAME

FIELD

The present disclosure relates generally to the field of semiconductor devices and specifically to a field effect transistor including contact via structures having a sub-lithographic lateral spacing and methods of making the same.

BACKGROUND

One of the limitations on lateral scaling of a field effect transistor is the minimum lateral spacing between a gate contact via structure and source/drain contact via structures. In order to ensure that the via cavities for the gate contact via structure and the source/drain contact via structures do not merge, a design rule on a minimum lateral spacing based on the capability of a lithographic tool is imposed between neighboring edges of a gate contact via structure and a source/drain contact via structure. This design rule limits the reduction in lateral size of the field effect transistor.

SUMMARY

According to an aspect of the present disclosure, a transistor includes a first active region and a second active region separated by a semiconductor channel, a gate stack structure including a gate dielectric and a gate electrode overlying the semiconductor channel, a gate contact via structure overlying and electrically connected to the gate electrode and having a top surface located in a first horizontal plane, a first active-region contact via structure overlying and electrically connected to the first active region, and having a top surface located within a second horizontal plane that underlies the first horizontal plane, a first connection line structure contacting a top surface of the first active-region contact via structure, and a first connection via structure contacting a top surface of the first connection line structure and having a top surface within the first horizontal plane.

According to another aspect of the present disclosure, a method of forming a transistor comprises forming a gate stack structure including a gate dielectric and a gate electrode over a semiconductor material of a first conductivity type, implanting ions of a second conductivity type into the semiconductor material using the gate stack structure as a mask to form a first active region and a second active region separated by a semiconductor channel, wherein one of the first active region and the second active region is a source region and another of the first active region and the second active region is a drain region, forming a first active-region contact via structure and a first connection line structure over the first active region, wherein the first active-region contact via structure is electrically connected to the first active region, and the first connection line structure is adjoined to a top portion of the first active-region contact via structure, forming a first connection via structure on a top surface of the first connection line structure, and forming a gate contact via structure over the gate electrode, wherein the gate contact via structure is electrically connected to the gate electrode, and wherein a top surface of the gate contact via structure and a top surface of the first connection via structure are formed within a first horizontal plane.

DETAILED DESCRIPTION

Figure 1:
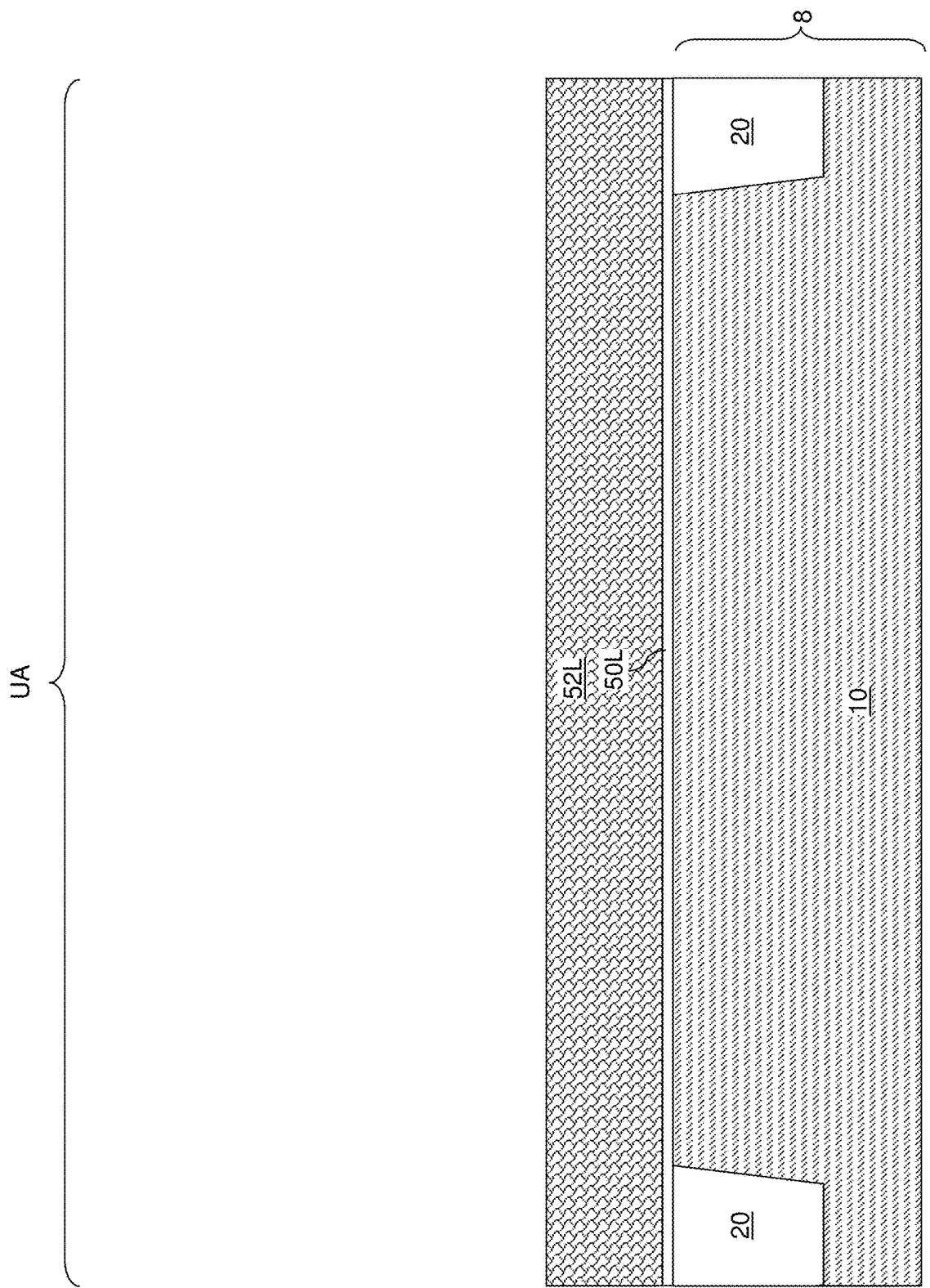
FIGS. 1 to 10 are sequential vertical cross-sectional views of steps used to form a pair of field effect transistors according to an embodiment of the present disclosure.

Embodiments of the present disclosure are directed to a field effect transistor including contact via structures having a sub-lithographic lateral spacing and methods of making the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, there above, and/or there below.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material", "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. A "source/drain region" refers to a doped semiconductor region that may function as a source region or a drain region. An "active region" refers to a source region of a field effect transistor or a drain region of a field effect transistor. A "source extension region" refers to a doped semiconductor region having a lesser dopant concentration than, and having a same type of doping as, a source region and including a portion disposed between the source region and the channel region. A "drain extension region" refers to a doped semiconductor region having a lesser dopant concentration than, and having a same type of doping as, a drain region and including a portion disposed between the drain region and the channel region. An "active region extension" refers to a source extension region or a drain extension region.

Referring to FIG. 1, an exemplary structure according to an embodiment of the present disclosure is illustrated. The exemplary structure includes a substrate 8, which may be a semiconductor substrate. As used herein, a "semiconductor substrate" refers to a substrate that includes at least one semiconductor material portion, i.e., at least one portion of a semiconductor material. In one embodiment, the substrate 8 includes a semiconductor material layer 10. The semiconductor substrate 8 may optionally include at least one additional material layer at a bottom portion thereof. In one embodiment, the semiconductor substrate 8 can be a bulk semiconductor substrate consisting of the semiconductor material layer 10 (e.g., single crystal silicon wafer), or can be a semiconductor-on-insulator (SOI) substrate including a buried insulator layer (such as a silicon oxide layer) underlying the semiconductor material layer 10, and a handle substrate underlying the buried insulator layer. Alternatively, the semiconductor material layer 10 may comprise an epitaxial semiconductor (e.g., single crystal silicon) layer deposited on a semiconductor substrate (e.g., silicon wafer) 8 or may comprise a doped well (e.g., doped silicon well) in the upper portions of the semiconductor substrate (e.g., silicon wafer) 8.

The semiconductor material layer 10 can include a lightly doped semiconductor material (e.g., silicon) portion on which at least one field effect transistor can be formed. In one embodiment, the entirety of the semiconductor material in the semiconductor material layer 10 may include the lightly doped semiconductor material. In another embodiment, the lightly doped semiconductor material can be a semiconductor well embedded within another semiconductor material having a different dopant concentration and optionally, a doping of the opposite conductivity type. The dopant concentration of the lightly doped semiconductor material portion may be optimized for a body region of the at least one field effect transistor to be subsequently formed. For example, the lightly doped semiconductor material portion may include electrical dopants at an atomic concentration in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations can also be employed. The conductivity type of the portion of the semiconductor material layer 10 to be subsequently employed as a body region of a field effect transistor is herein referred to as a first conductivity type, which may be p-type for an n-type field effect transistor or n-type for a p-type field effect transistor.

The semiconductor material of the semiconductor material layer 10 can be an elemental semiconductor material (such as silicon) or an alloy of at least two elemental semiconductor materials (such as a silicon-germanium alloy), or can be a compound semiconductor material (such as a III-V compound semiconductor material or a II-VI compound semiconductor material), or can be an organic semiconductor material. The thickness of the semiconductor material layer 10 can be in a range from 0.5 mm to 2 mm in case the semiconductor material layer 10 is a bulk semiconductor substrate. In case the semiconductor material layer 10 is a semiconductor-on-insulator substrate, the thickness of the top semiconductor material layer within the semiconductor material layer 10 may be in a range from 100 nm to 1,000 nm, although lesser and greater thicknesses can also be employed.

Pad layers (not shown) such as a stack of a silicon oxide layer and a silicon nitride layer can be deposited over the top surface of the semiconductor material layer 10, and can be lithographically patterned to cover each device region, i.e., each region in which semiconductor devices are to be subsequently formed. An anisotropic etch process can be performed to etch shallow trenches that vertically extend through the pad layers and into an upper portion of the semiconductor material layer 10. The photoresist layer can be employed as an etch mask layer during the anisotropic etch process. The depth of the shallow trenches, as measured from the horizontal plane including the top surface of the semiconductor material layer 10, can be in a range from 300 nm to 3 microns, although lesser and greater depths may also be employed. The shallow trenches can be interconnected among one another to provide multiple device regions that correspond to a respective unetched portion of the semiconductor material layer 10. The photoresist layer can be subsequently removed, for example, by aching.

In one embodiment, an array of field effect transistors can be formed over the substrate 8. In this case, the array of field effect transistors may comprise a periodic repetition of a unit field effect transistor area formed in a respective unit area UA. While one unit area UA is illustrated in FIG. 1, it is understood that multiple instances of the unit area UA can be repeated as a one-dimensional periodic array or as a two-dimensional periodic array.

At least one dielectric material, such as undoped silicate glass, can be deposited in the shallow trenches by a conformal deposition process such as a chemical vapor deposition process. A chemical mechanical planarization process can be performed to remove portions of the at least one dielectric material from above the pad layers. The remaining portions of the at least one dielectric material constitute shallow trench isolation structures 20. The pad layers can be subsequently removed, for example, by wet etch processes. For example, a wet etch employing hot phosphoric acid can be performed to remove the silicon nitride layer, and a wet etch process employing dilute hydrofluoric acid can be performed to remove the silicon oxide layer. Physically exposed surfaces of the shallow trench isolation structures 20 may be collaterally recessed during removal of the silicon oxide layer.

Generally, a shallow trench isolation structure 20 comprising a dielectric material can be formed in an upper region of the semiconductor material layer 10. The semiconductor material layer can have a doping of the first conductivity type, and the shallow trench isolation structure 20 can laterally surround each device region of the semiconductor material layer 10 that is located within a respective unit area UA.

A gate dielectric layer 50L having a thickness suitable for operation of a high voltage field effect transistor can be formed on all physically exposed surfaces of the semiconductor material layer 10, for example, by thermal oxidation of the physically exposed surface portions of the semiconductor material layer 10. If the semiconductor material layer 10 includes single crystalline silicon, the gate dielectric layer can consist essentially of thermal silicon oxide. The thickness of the gate dielectric layer 50L can be in range from 1 nm to 50 nm, such as in a range from 6 nm to 30 nm, although lesser and greater thicknesses can also be employed.

A gate electrode material layer 52L can be deposited over the gate dielectric layer SOL. The gate electrode material layer 52L includes one or more layers of an electrically conductive material that can be employed as a gate electrode material. In an illustrative embodiment, the gate electrode material layer 52L can include a semiconductor gate electrode layer including a doped semiconductor material. For example, the semiconductor gate electrode layer can include a doped polysilicon layer having a thickness in a range from 30 nm to 150 nm. Optionally, the gate electrode material layer 52L may comprise a metallic gate electrode layer deposited on a top surface of the semiconductor gate electrode layer. The metallic gate electrode layer can include a metallic material, such as a transition metal or metal silicide and can have a thickness in a range from 50 nm to 150 nm, although lesser and greater thicknesses may also be employed. In an alternative embodiment, the order of steps may be changed. For example, the shallow trench isolation structure 20 may be formed at a later process step, such after depositing the gate electrode material layer 52L. In such an alternative embodiment, the gate electrode material layer 52L, the gate dielectric layer SOL and the semiconductor material layer 10 may be patterned together to form the shallow trenches prior to forming the shallow trench isolation structure 20.

Figure 2:
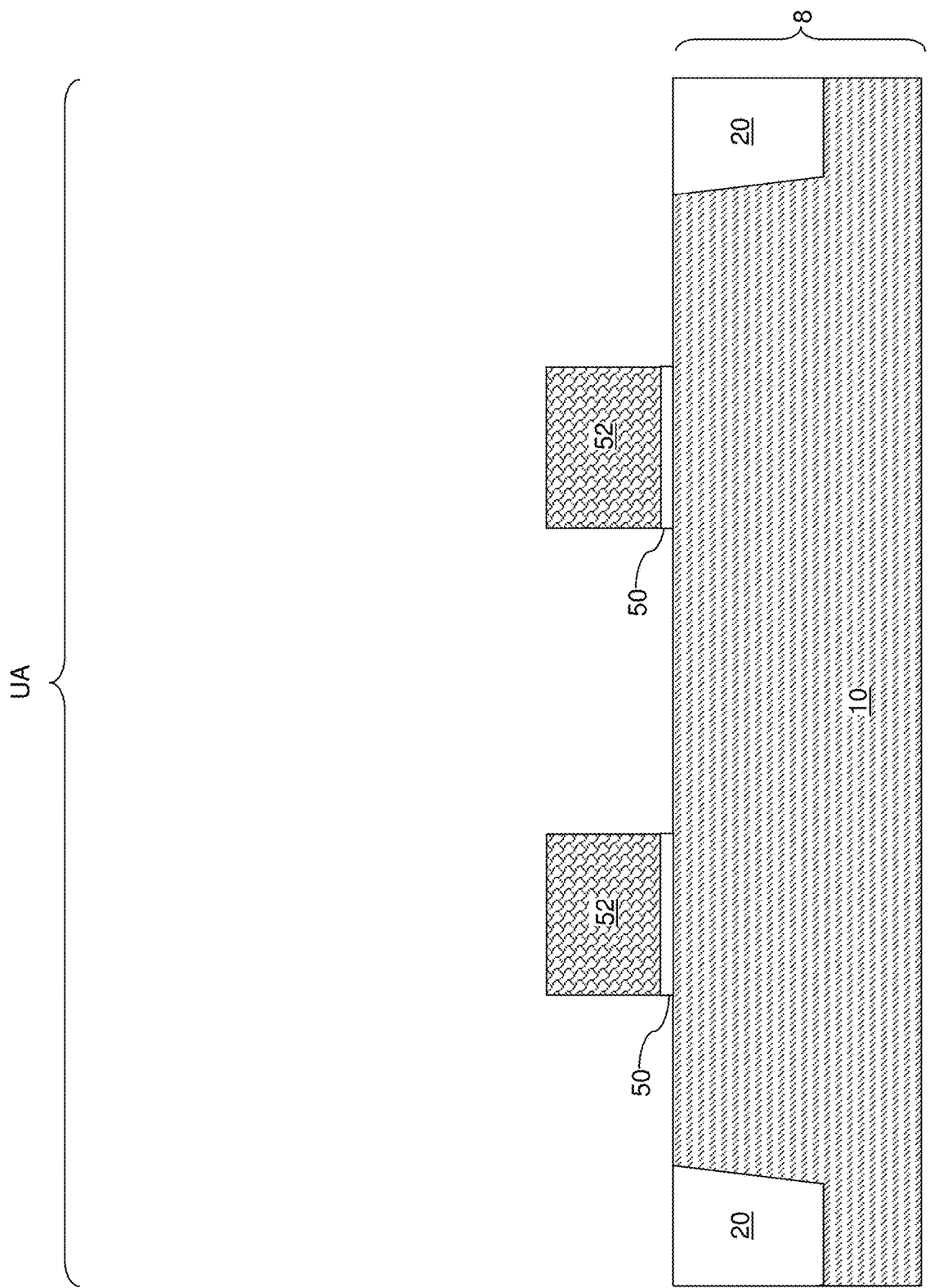

Referring to FIG. 2, a photoresist layer (not shown) can be applied over the gate electrode material layer 52L, and can be lithographically patterned to form gate patterns, i.e., patterns of gate electrodes to be subsequently formed. In one embodiment, the gate patterns can include two discrete photoresist material portions that laterally extend over a portion of the semiconductor material layer 10 within each unit area UA. An anisotropic etch process can be performed to transfer the gate patterns through the gate electrode material layer 52L and optionally through the gate dielectric layer SOL. The photoresist layer can be removed, for example, by aching. Each patterned portion of the gate dielectric layer SOL comprises a gate dielectric 50. Each patterned portion of the gate electrode material layer 52L comprises a gate electrode 52. In one embodiment, a pair of gate electrodes 52 may be formed within each unit area UA.

In one embodiment, each gate electrode 52 may include portions that extend over the shallow trench isolation structure 20 (e.g., in and out of the plane of FIG. 2). The lateral distance between two edges of a gate electrode 52 that overlie a portion the semiconductor material layer 10 that is laterally enclosed by the shallow trench isolation structure 20 is herein referred to as a gate length, which may be in a range from 3 nm to 500 nm, although lesser and greater dimensions may also be employed.

Figure 3:
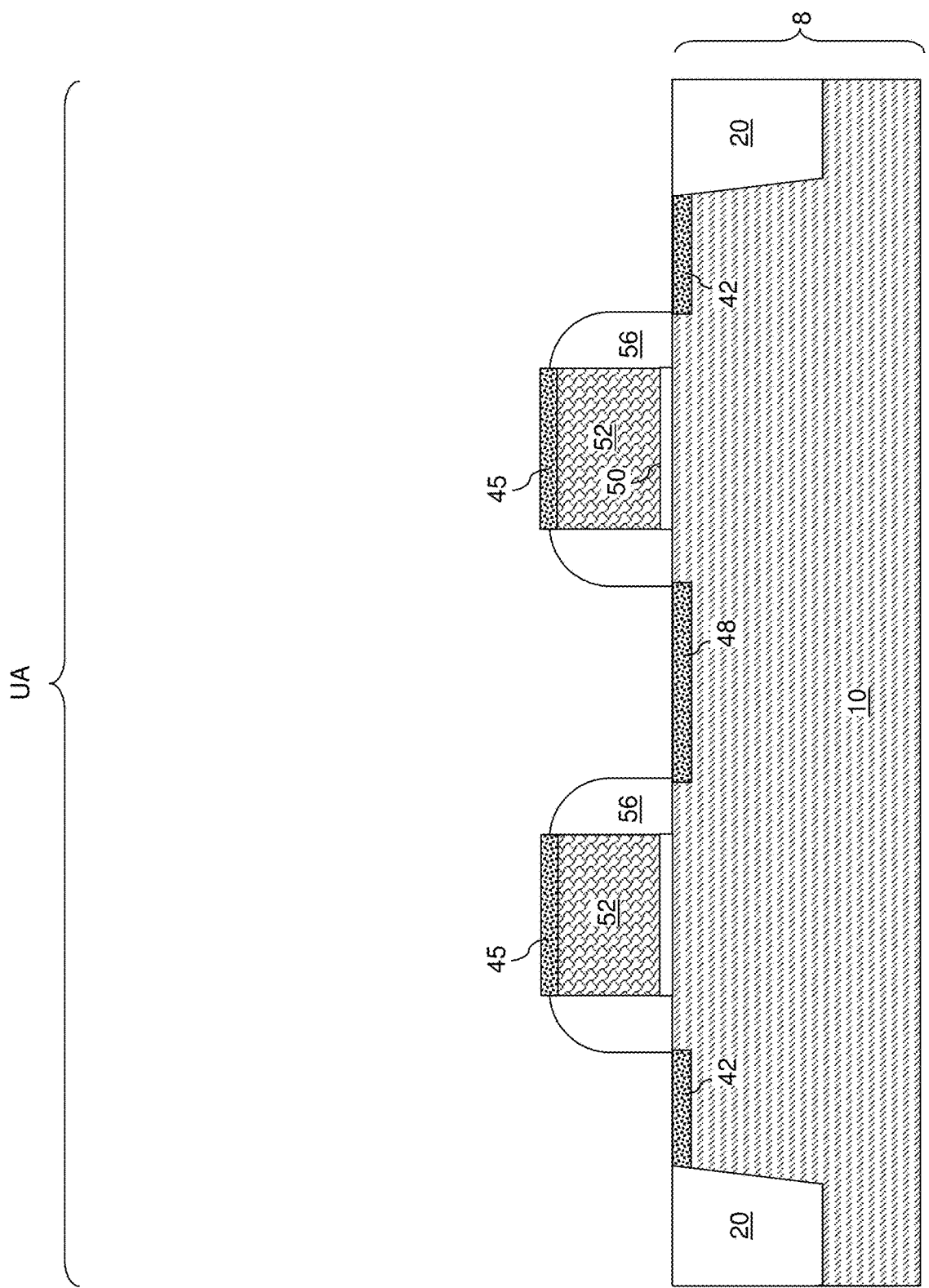

Referring to FIG. 3, at least one conformal dielectric material layer, such as a silicon oxide or a silicon nitride layer can be deposited, for example, by a chemical vapor deposition process. The thickness of the at least one conformal dielectric material layer can be less than one half of the lateral separation distance between the pair of gate electrodes 52 in each unit area UA. For example, the thickness of the at least one conformal dielectric material layer may be in a range from 5 nm to 300 nm, such as from 20 nm to 150 nm, although lesser and great thicknesses may also be employed.

The at least one conformal dielectric layer can be anisotropic ally etched by an anisotropic sidewall spacer etch process, such as a reactive ion etch process. Each remaining vertically-extending portion of the at least one conformal dielectric layer comprises a respective gate spacer 56. Each gate spacer 56 comprises a sidewall spacer that laterally surrounds a gate electrode 52. The lateral thickness of each gate spacer 56 may be in a range from 5 nm to 300 nm, such as from 20 nm to 150 nm, although lesser and great thicknesses may also be employed.

Metal-semiconductor alloy regions (42, 48, 45) are subsequently formed. Metal-semiconductor alloy regions may comprise metal silicide regions. For example, a metal or metal alloy layer that forms a metal-semiconductor alloy with the semiconductor material of the semiconductor material layer 10 and/or with the semiconductor material within the gate electrodes 52 may be deposited by a conformal or non-conformal deposition process. For example, if the semiconductor material layer 10 and/or the gate electrodes 52 comprise silicon, then the metal may be a silicide-forming metal, such as tungsten, nickel, titanium, cobalt, platinum, molybdenum or alloys thereof. In one embodiment, the layer comprises a nickel-platinum alloy containing 10 to 90 atomic percent nickel and 90 to 10 atomic percent platinum.

A thermal anneal process can be performed at an elevated temperature to induce a reaction between the metal(s) and the semiconductor material(s) of the semiconductor material layer 10 and the gate electrodes 52. The elevated temperature may be in a range from 500 degrees Celsius to 900 degrees Celsius depending on the material compositions of the metal or metal alloy layer and the semiconductor material(s) of the semiconductor material layer 10 and the gate electrodes 52. The reacted portions of the metal or metal alloy layer form the metal-semiconductor alloy regions (42, 48, 45). For example, a nickel-platinum alloy layer forms a nickel-platinum silicide regions (42, 48, 45). Without wishing to be bound by a particular theory, it is believed that nickel-platinum silicide regions (42, 48) have a smaller lateral extension under the gate spacers 56 than titanium silicide regions. The limited lateral extension of the nickel-platinum silicide regions (42, 48) permits using a smaller gate electrode 52 width, thus reducing transistor size. Furthermore, the nickel-platinum silicide regions (42, 48) reduce junction leakage current in the transistor.

Unreacted portions of the metal layer that do not form the metal-semiconductor alloy regions (42, 48, 45) can be removed selective to the metal-semiconductor alloy regions (42, 48, 45). For example, a selective wet etch process may be performed to remove the unreacted portions of the metal layer.

Figure 4:
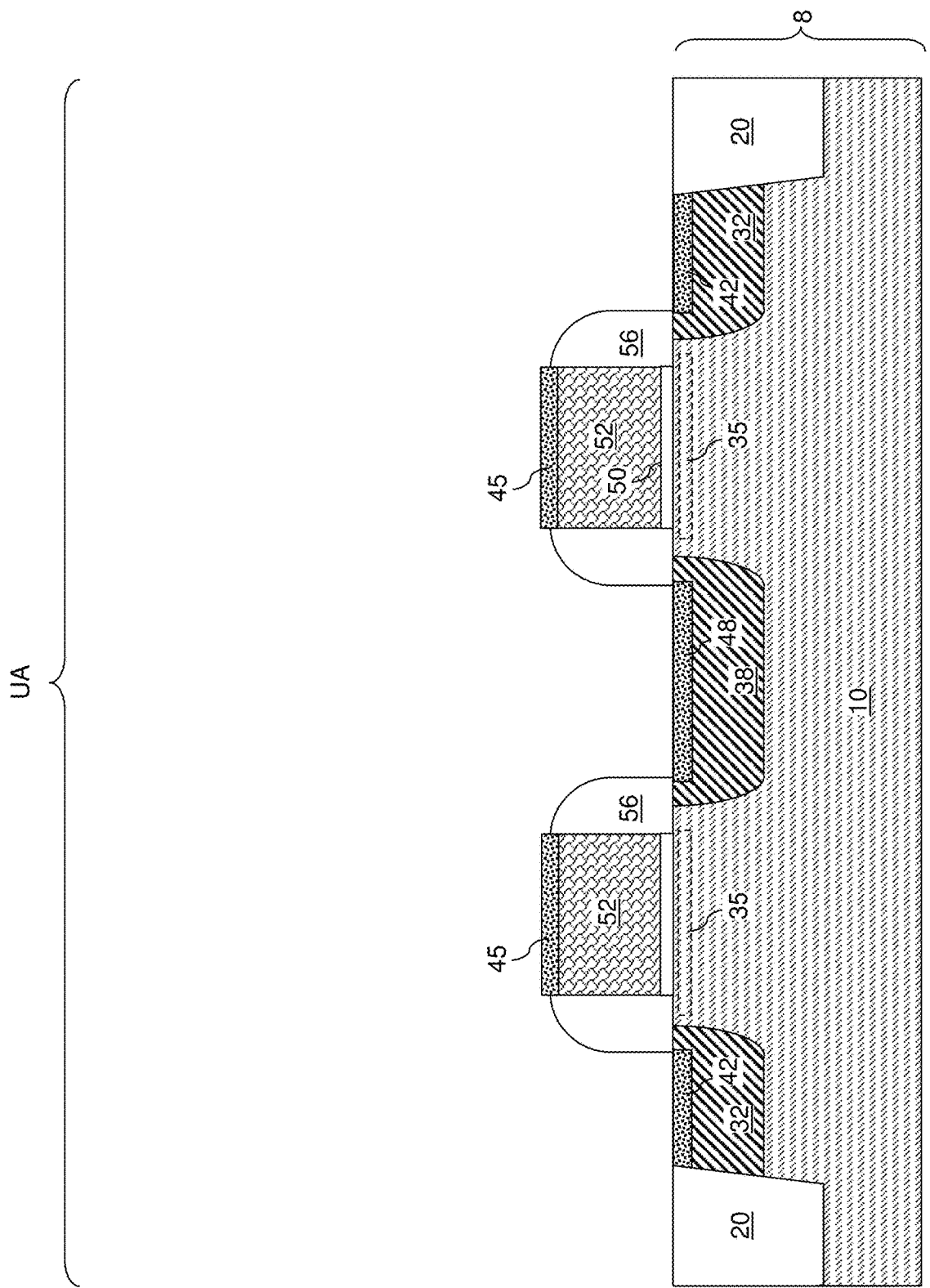

Referring to FIG. 4, an ion implantation process can be performed to implant dopants of the second conductivity type into the surface portions of the semiconductor material layer 10 and the metal-semiconductor alloy regions (42, 48) that are not covered by the gate electrodes 52 or the gate spacers 56. Source/drain regions (32, 38) are formed simultaneously by implanting electrical dopants of the second conductivity type into the surface portions of the semiconductor material layer 10 and the metal-semiconductor alloy regions (42, 48). The source/drain regions (32, 38) include dopants of the second conductivity type at a second atomic concentration, which may be in a range from $1.0 \times 10^{19}/cm^3$ to $2.0 \times 10^{21}/cm^3$, such as from $2.0 \times 10^{19}/cm^3$ to $1.0 \times 10^{21}/cm^3$, although lesser and greater atomic concentrations may also be employed.

The source/drain regions (32, 38) within each unit area UA include a pair of first active region 32 and a second active region 38. The second active region 38 may be formed between the pair of gate electrodes 52 in each unit area UA. The pair of first active regions 32 may be laterally spaced from the second active region 38 by a respective gate electrode 52 and that gate spacers 56 in each unit area UA. The first active regions 32 and the second active regions 38 are collectively referred to as active regions, or as source/drain regions. In one embodiment, the first active regions 32 may be employed as source regions and the second active regions 38 may be employed as drain regions. In another embodiment, the first active regions 32 may be employed as drain regions and the second active regions 38 may be employed as source regions. In one embodiment, each of the first active region 32 and the second active region 38 can have a respective planar bottom surface located at a depth from a top surface of the semiconductor material layer 10. The depth can be in a range from 20 nm to 600 nm, such as from 40 nm to 300 nm, although lesser and greater depths may also be employed.

The metal-semiconductor alloy regions (42, 48, 45) may comprise first metal-semiconductor alloy regions 42 that are located on a top surface of a respective first active region 32, second metal-semiconductor alloy regions 48 that are formed on a top surface of a respective second active region 38, and gate metal-semiconductor alloy regions 45 that are formed on a top surface of a respective gate electrode 52. In case the gate electrode 52 comprises a metallic gate electrode material in addition to a semiconductor gate electrode material, the gate metal-semiconductor alloy regions 45 may be omitted.

In an alternative embodiment, the order of forming the active regions (32, 38) and the metal-semiconductor alloy regions (42, 48, 45) may be reversed. In the alternative embodiment, the active regions (32, 38) are formed after forming the gate spacers 56, and the metal-semiconductor alloy regions (42, 48, 45) are formed after forming the active regions (32, 38).

Generally, each gate stack structure (50, 52) overlies a channel region 35, which comprises a portion of the semiconductor material layer 10 located between a first active region 32 and a second active region 38. The channel region 35 may comprise a semiconductor material of the first conductivity type (e.g., p-type) that is opposite of the second conductivity type (e.g., n-type) of the active regions (32, 38). The channel region 35 may be doped separately from the semiconductor material layer 10 (e.g., semiconductor substrate or well) in which it is located. Alternatively, the channel region 35 may have the same doping as the semiconductor material layer 10 (e.g., the doped semiconductor substrate or well) in which it is located. Each gate structure (50, 52) comprises a gate dielectric 50 and a gate electrode 52. Each first active region 32 and each second active region 38 may be formed in or on upper portions of the semiconductor material layer 10 by introducing dopants of a second conductivity type that is an opposite of the first conductivity type into the upper portions of the semiconductor material layer 10. In one embodiment, one of the first active region 32 and the second active region 38 is a source region and another of the first active region 32 and the second active region 38 is a drain region.

Figure 5:
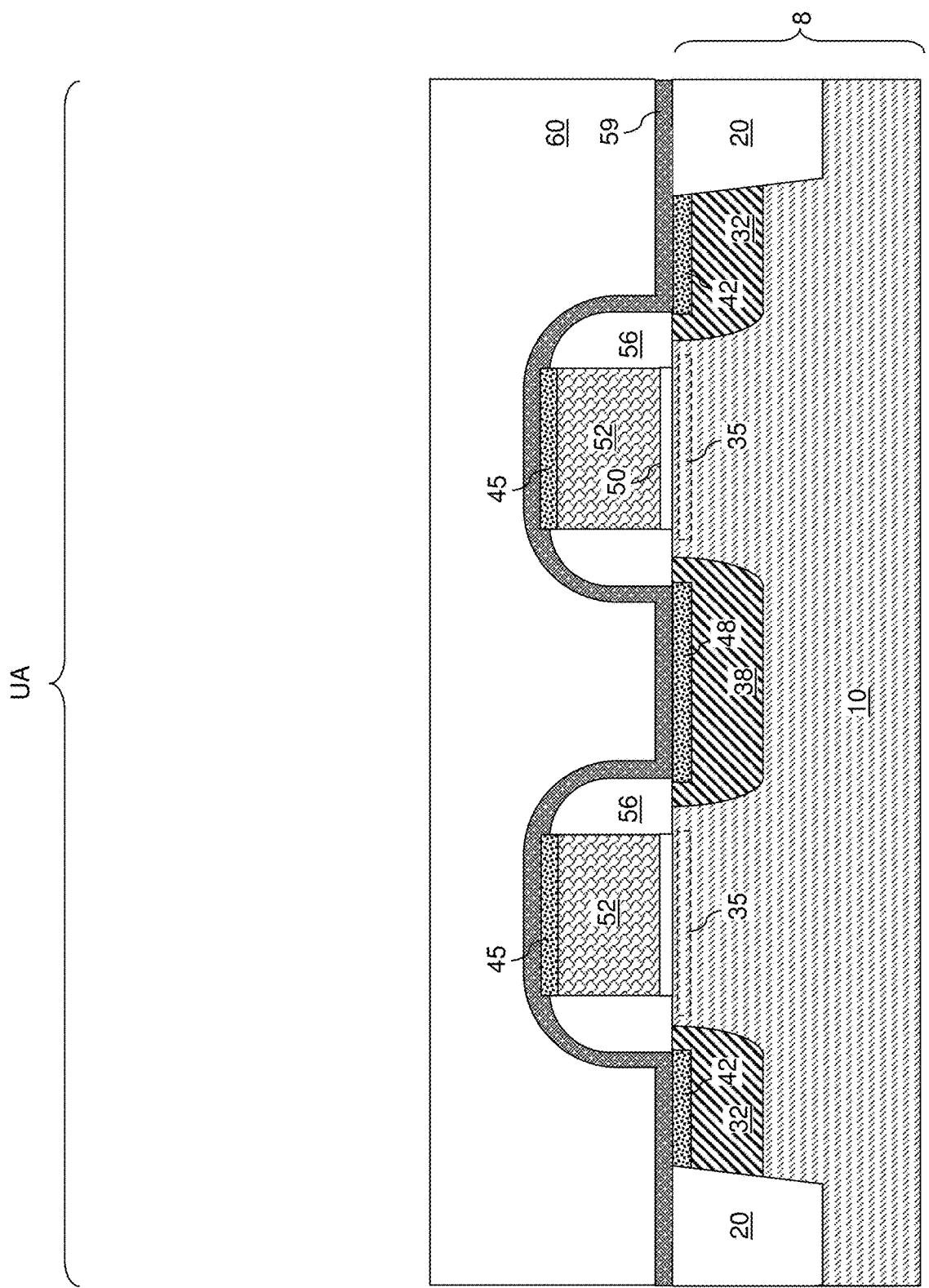

Referring to FIG. 5, a dielectric liner 59 can be formed over the substrate 8, the gate structures (50, 52), and the gate spacers 56. The dielectric liner 59 includes a dielectric material such as silicon nitride, silicon nitride carbide (i.e., silicon carbonitride), or a dielectric metal oxide (e.g., aluminum oxide). The dielectric liner 59 may be formed by a conformal deposition process such as a chemical vapor deposition process or an atomic layer deposition process. The dielectric liner 59 continuously extends over the metal-semiconductor alloy regions (42, 48, 45), the gate electrodes 52, the gate spacers 56, the first active regions 32, and the second active regions 38. The dielectric liner 59 comprises vertically-extending portions that laterally surround a respective gate structure (50, 52) and a respective gate spacer 56, and horizontally-extending portions that is located over the metal-semiconductor alloy regions (42, 48, 45). Each bottom periphery of the vertically extending portions of the dielectric liner 59 is adjoined to the respective adjacent horizontally-extending portions. The thickness of the dielectric liner 59 may be in a range from 5 nm to 50 nm, although lesser and greater thicknesses may also be employed.

A first dielectric material layer 60 can be deposited over the dielectric liner 59. The first dielectric material layer 60 comprises and/or consists essentially of a first dielectric material. In one embodiment, the first dielectric material comprises a linearizable dielectric material (such as undoped silicate glass or a doped silicate glass) or a self-planarizing dielectric material (such as flowable oxide). In case the first dielectric material comprises a linearizable dielectric material, a planarization process (such as a chemical mechanical polishing (CMP) process) may be performed in to provide a planar top surface for the first dielectric material layer 60. The top surface of the first dielectric material layer 60 can be formed above a horizontal plane including topmost surfaces of the dielectric liner 59. A vertical distance between the top surface of the first dielectric material layer 60 and the horizontal plane including the topmost two surfaces of the dielectric liner 59 may be in a range from 30 nm to 600 nm, such as from 60 nm to 300 nm, although lesser and greater vertical distances may also be employed.

Figure 6:
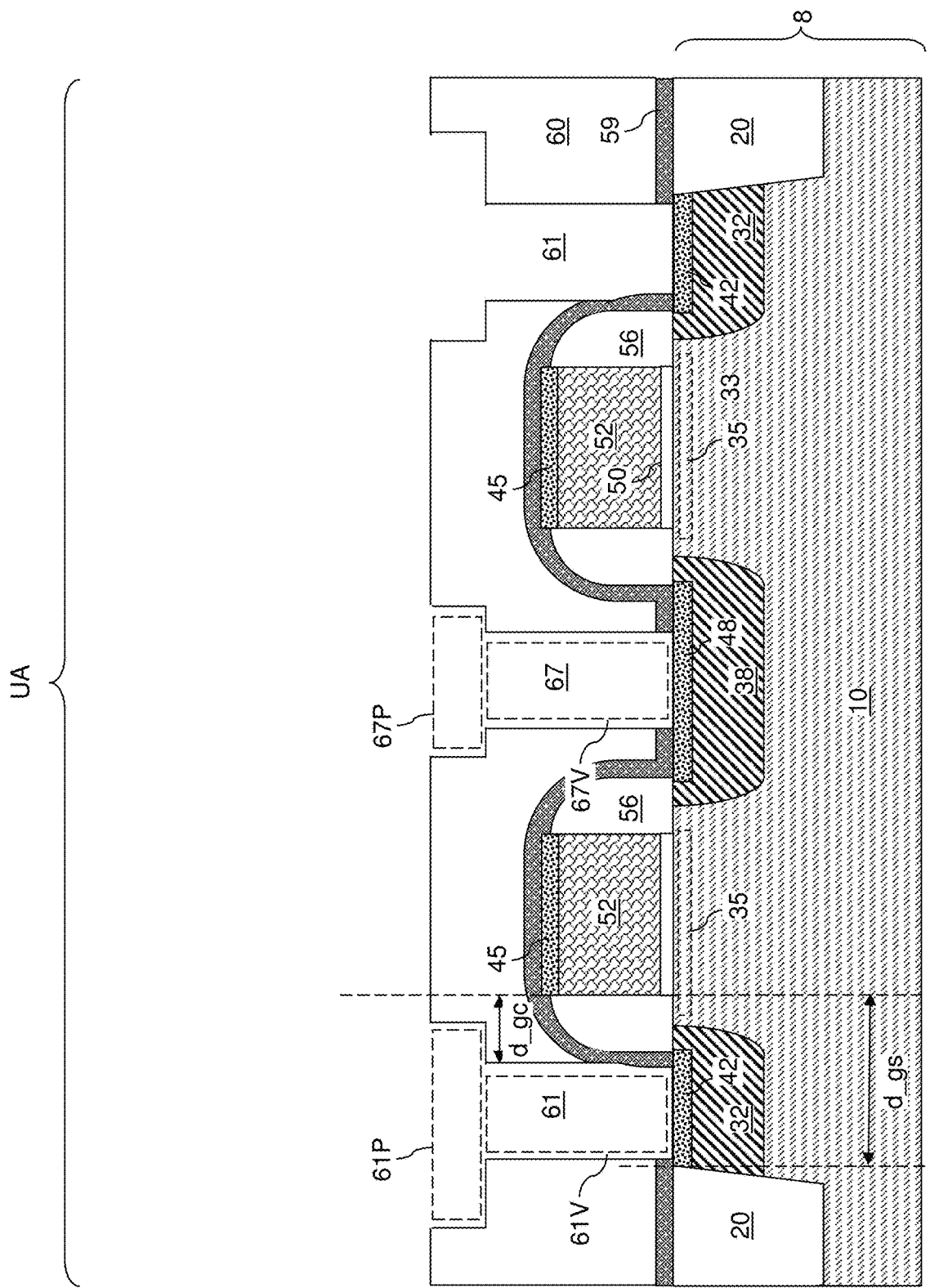

Referring to FIG. 6, integrated line-and-via cavities (61, 67) may be formed through the first dielectric material layer 60 and the dielectric liner 59 such that a top surface of a respective one of the first and second metal-semiconductor alloy regions (42, 48) is exposed at the bottom of each integrated line-and-via cavity (61, 67). In an alternative embodiment in which the first and second metal-semiconductor alloy regions (42, 48) are not formed, a top surface of a respective one of the first active regions 32 and the second active regions 38 may be physically exposed at the bottom of each integrated line-and-via cavity (61, 67).

Generally, the integrated line-and-via cavities (61, 67) may be formed by employing two lithographic patterning processes and two anisotropic etch processes. For example, a first photoresist layer (not shown) may be applied over the first dielectric material layer 60, and may be lithographically patterned to form a pattern of the discrete line-shaped openings in areas having an overlap with the respective underlying one of the first and second metal-semiconductor alloy regions (42, 48). In case the first and second metal-semiconductor alloy regions (42, 48) are not present, the pattern of the discrete lines is formed in areas having an overlap with the respective underlying one of the first active regions 32 and the second active regions 38. A first anisotropic etch process can be performed to transfer the pattern of the discrete line-shaped openings into an upper portion of the first dielectric material layer 60. Line cavities (61P, 67P) can be formed in volumes from which the material of the first dielectric material layer 60 is etched by the first anisotropic etch process. The line cavities (61P, 67P) comprise first line cavities 61P overlying a respective one of the first metal-semiconductor alloy regions 42, and second line cavities 67P overlying a respective one of the second metal-semiconductor alloy regions 48. The depth of the line cavities (61P, 67P) may be in a range from 10% to 40% of the maximum thickness of the first dielectric material layer 60. The first photoresist layer can be removed, for example, by aching.

A second photoresist layer (not shown) may be applied over the first dielectric material layer 60, and may be lithographically patterned to form a pattern of the discrete openings within areas of the line cavities (61P, 67P). Each discrete opening in the second photoresist layer can be formed in within the area of a respective underlying line cavity (61P, 67P). According to an aspect of the present disclosure, a periphery of one, a plurality or each of the openings in the second photoresist layer that overlies a respective first metal-semiconductor alloy region 42 has an areal overlap with a vertically-extending portion of the dielectric liner 59 located over the gate spacer 56. A periphery of one, a plurality or each of the openings in the second photoresist layer that overlies a respective second metal-semiconductor alloy region 48 may or may not have an areal overlap with any vertically-extending portion of the dielectric liner 59 located over the gate spacer 56. A second anisotropic etch process can be performed to transfer the pattern of the discrete openings in the second photoresist layer through the first dielectric material layer 60 and through a respective segment of the horizontally-extending portion of the dielectric liner 59, and to form contact via cavities (61V, 67V). A first contact via cavity 61V can be formed above each first active region 32, and a second contact via cavity 67V can be formed above each second active region 38. The second photoresist layer can be subsequently removed, for example, by aching. A boundary of a first contact via cavity 61V may comprise a partially-etched segment of a vertically-extending portion of the dielectric liner 59, which may comprise a contoured surface segment, such as a concave surface segment.

In an alternative embodiment, the order of forming the line cavities and then via cavities may be reversed. In the alternative embodiment, the via cavities (61V, 67V) are formed first, followed by forming the line cavities (61P, 67P).

Each contiguous combination of a first contact via cavity 61V and a first line cavity 61P constitutes a first line-and-via cavity 61. Each continuous combination of a second contact via cavity 67V and a second line cavity 67P constitutes a second line-and-via cavity 67. A top surface of a first metal-semiconductor alloy region 42 or a first active region 32 can be physically exposed at the bottom of each first integrated line-and-via cavity 61. A top surface of a second metal-semiconductor alloy region 48 or a second active region 38 can be physically exposed at the bottom of each second integrated line-and-via cavity 67.

In one embodiment, each first line cavity 61P may have a first portion having an areal overlap with a respective underlying first contact via cavity 61V, and a second portion that does not have an areal overlap with the first contact via cavity 61V. Likewise, each second line cavity 67P may have a second portion having an areal overlap with a respective underlying second contact via cavity 67V, and a second portion that does not have an areal overlap with the second contact via cavity 67V.

In one embodiment, one, a plurality or each of the first contact via cavities 61V comprises a straight sidewall surface segment that extends straight along a vertical direction or with a taper angle with respect to the vertical direction and not containing a surface segment of the dielectric liner 59, and a contoured sidewall surface segment that comprises a non-planar surface segment that contains a non-planar and tapered surface segment of the dielectric liner 59.

In one embodiment, the dielectric liner 59 comprises vertically-extending portions laterally surrounding a respective gate spacer 56, and a horizontally-extending portion adjoined to a bottom periphery of each of the vertically-extending portions. A sidewall of one, a plurality or each of the vertically-extending portions of the dielectric liner 59 may be physically exposed to a respective one of the first contact via cavities 61V. Optionally, one, a plurality or each of the second contact via cavities 67V may be laterally spaced from the vertically-extending portions of the dielectric liner 59, and may extend through the horizontally-extending portion of the dielectric liner 59.

In one embodiment, the minimum lateral distance between a first contact via cavity 61V and a vertical plane including a most proximal sidewall of the gate electrodes 52 is herein referred to as a gate-to-contact distance d_gc. According to an aspect of the present disclosure, the gate-to-contact distance d_gc may be less than the sum of the lateral thickness of a gate spacer 56 and a thickness of the dielectric liner 59. Alternatively, the gate-to-contact distance d_gc may be the same as or greater than the sum of the lateral thickness of a gate spacer 56 and a thickness of the dielectric liner 59. In one embodiment, the gate-to-contact distance d_gc may be greater than the lateral thickness of a gate spacer 56. According to an aspect of the present disclosure, the lateral distance between a gate electrode 52 and a most proximal second contact via cavity 67V may be greater than the sum of the lateral thickness of a gate spacer 56 and a thickness of the dielectric liner 59. The direction connecting a first active region 32 and a second active region 38 that are adjoined to a channel region 35 is herein referred to as a channel direction. The lateral spacing between a sidewall of a gate electrode 52 and a most proximal edge of the shallow trench isolation structure 20 along the channel direction is herein referred to as a gate-to-shallow-trench-isolation distance d_gs. The entirety of each physically exposed area of a first metal-semiconductor alloy region 42 may be laterally spaced from a sidewall of a gate electrode 52 by a lateral distance that is less than the gate-to-shallow-trench-isolation distance d_gs.

Figure 7:
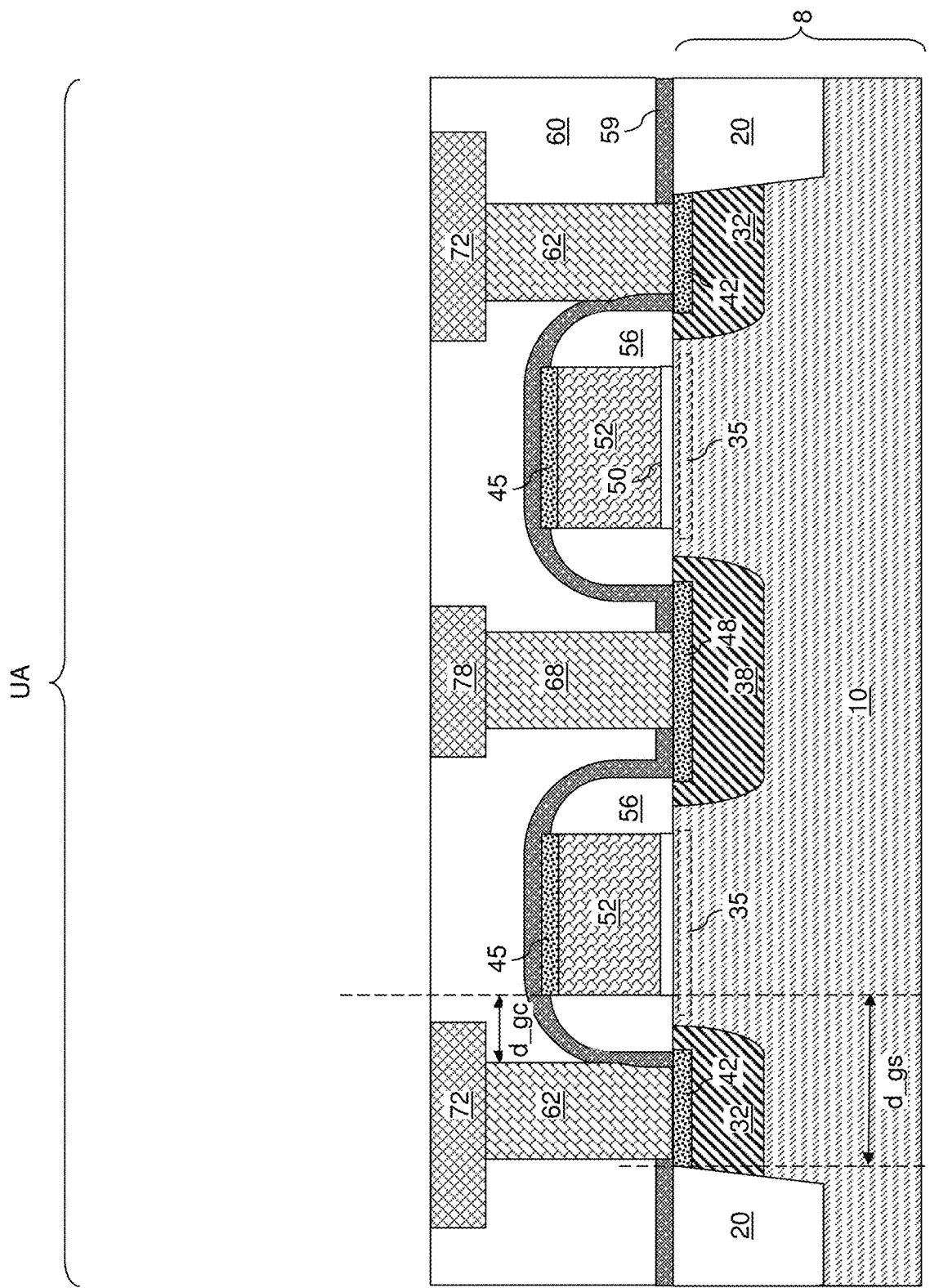

Referring to FIG. 7, at least one first conductive material, such as at least one metallic material, can be deposited in each of the integrated line-and-via cavities (61, 67). The at least one first conductive material may comprise, for example, a metallic barrier liner (not expressly shown) including a conductive metal nitride material and a metallic fill material (not expressly shown) such as a metal. The conductive metal nitride material may comprise titanium nitride, tungsten nitride, tantalum nitride, molybdenum nitride, etc. The thickness of the metallic barrier liner may be in a range from 3 nm to 30 nm, although lesser and greater thicknesses may also be employed. The metallic fill material may comprise tungsten, tantalum, titanium, molybdenum, cobalt, molybdenum, ruthenium, copper, etc.

Excess portions of the at least one metallic material can be removed from above the horizontal plane including the top surface of the first dielectric layer 60 by a planarization process. The planarization process may comprise a chemical mechanical polishing (CMP) process. Each remaining portion of the at least one metallic material filling a respective integrated line-and-via cavity (61, 67) constitutes an integrated line-and-via structure {(62, 72), (68, 78)}. The integrated line-and-via structures {(62, 72), (68, 78)} comprise first integrated line-and-via structures (62, 72) that are formed in the first integrated line-and-via cavities 61, and second integrated line-and-via structures (68, 78)} that are formed in the second integrated line-and-via cavities 67.

Each first integrated line-and-via structure (62, 72) comprises a first active-region contact via structure 62 formed in a respective first contact via cavity 61V, and a first connection line structure 72 formed in a respective first line cavity 61P. Each second integrated line-and-via structure (68, 78) comprises a second active-region contact via structure 68 formed in a respective second contact via cavity 67V, and a second connection line structure 78 formed in a respective second line cavity 67P. The first connection line structure 72 and/or the second connection line structure 78 may optionally include a respective pad portion which forms a landing pad for an overlying via structure to be formed during a subsequent step.

Generally, each first integrated line-and-via contact via cavity 61 can be filled with at least one first conductive material, and a combination of a first active-region contact via structure 62 and a first connection line structure 72 is formed in each first integrated line-and-via contact via cavity 61. Further, each second integrated line-and-via contact via cavity 67 can be filled with the at least one first conductive material, and a combination of a second active-region contact via structure 68 and a second connection line structure 78 is formed in each second integrated line-and-via contact via cavity 67.

In one embodiment, each first active-region contact via structure 62 may be formed directly on a top surface of a respective first metal-semiconductor alloy region 42. In this case, each first active-region contact via structure 62 may be electrically connected to a respective first active region 32 through the respective first metal-semiconductor alloy region 42. In another embodiment, the first metal-semiconductor alloy regions 42 are not formed, and each first active-region contact via structure 62 may be electrically connected to a respective first active region 32 by direct contact.

In one embodiment, each second active-region contact via structure 68 may be formed directly on a top surface of a respective second metal-semiconductor alloy region 48. In this case, each second active-region contact via structure 68 may be electrically connected to a respective second active region 38 through the respective second metal-semiconductor alloy region 48. In another embodiment, the second metal-semiconductor alloy regions 48 are not formed, and each second active-region contact via structure 68 may be electrically connected to a respective second active region 38 by direct contact.

In one embodiment, the dielectric liner 59 comprises a vertically-extending portion laterally surrounding a gate spacer 56 and a horizontally-extending portion adjoined to a bottom periphery of the vertically-extending portion. In one embodiment, the first active-region contact via structure 62 may be formed directly on a sidewall of the vertically-extending portion of the dielectric liner 59, while the second active-region contact via structure 68 may be laterally spaced from the vertically-extending portion of the dielectric liner 59 and may extend through the horizontally-extending portion of the dielectric liner 59. In one alternative embodiment, both the first active-region contact via structure 62 and the second active-region contact via structure 68 may be formed directly on a sidewall of the vertically-extending portion of the dielectric liner 59. In another alternative embodiment, both the first active-region contact via structure 62 and the second active-region contact via structure 68 may be laterally spaced from the vertically-extending portion of the dielectric liner 59.

In one embodiment, the first active-region contact via structure 62 may comprise a straight sidewall surface segment that extends straight along a vertical direction or with a taper angle with respect to the vertical direction, and a contoured sidewall surface segment that comprises a non-planar surface segment that contacts a non-planar and tapered surface segment of the dielectric liner 59.

Figure 8:
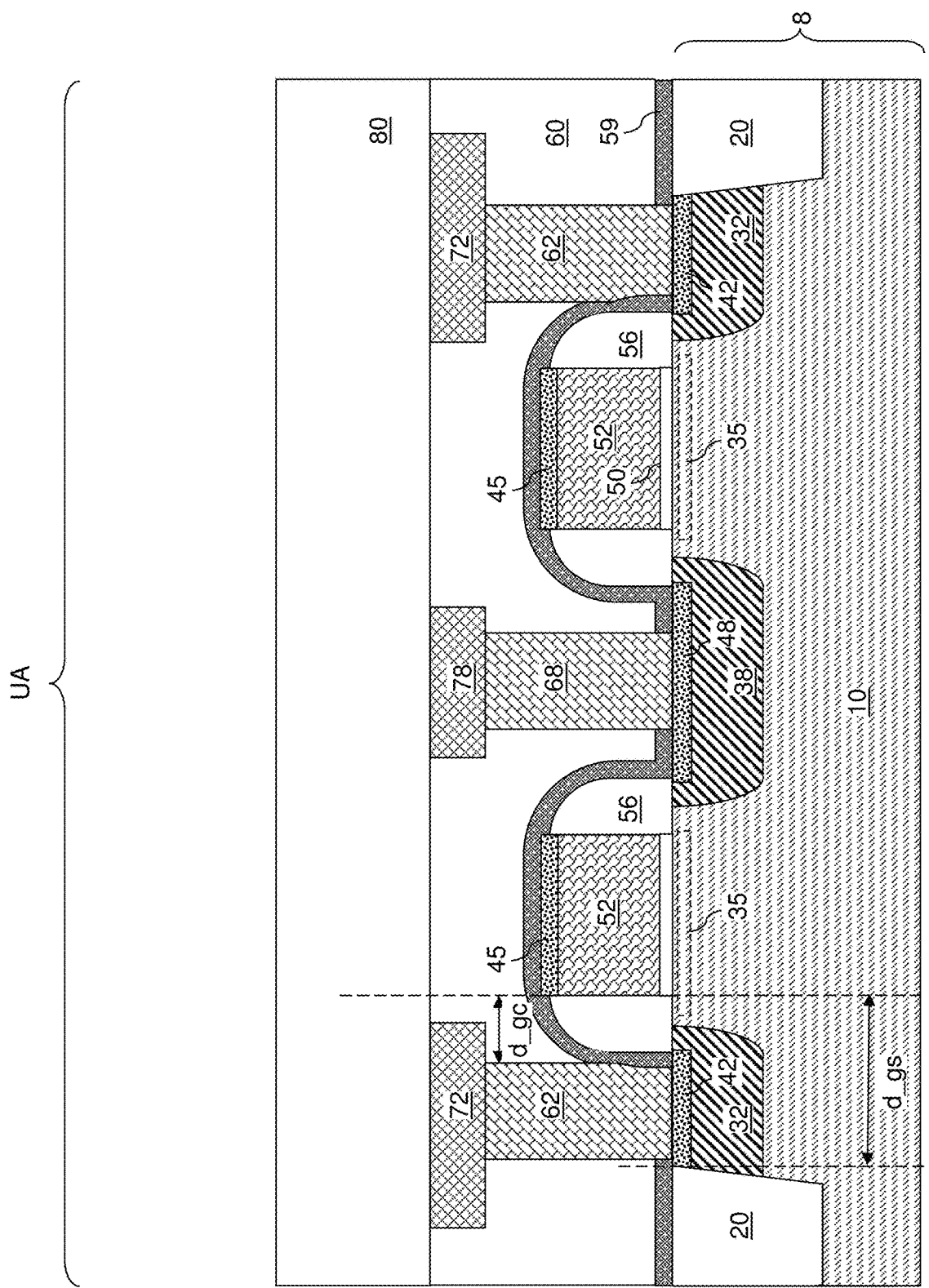

Referring to FIG. 8, a second dielectric material layer 80 can be deposited over the first dielectric material layer 60. The second dielectric material layer 80 comprises a dielectric material such as undoped silicate glass, a doped silicate glass, organ silicate glass, or a combination thereof. The thickness of the second dielectric material layer 80 may be in a range from 100 nm to 800 nm, such as from 200 nm to 400 nm, although lesser and greater vertical distances may also be employed.

Figure 9:
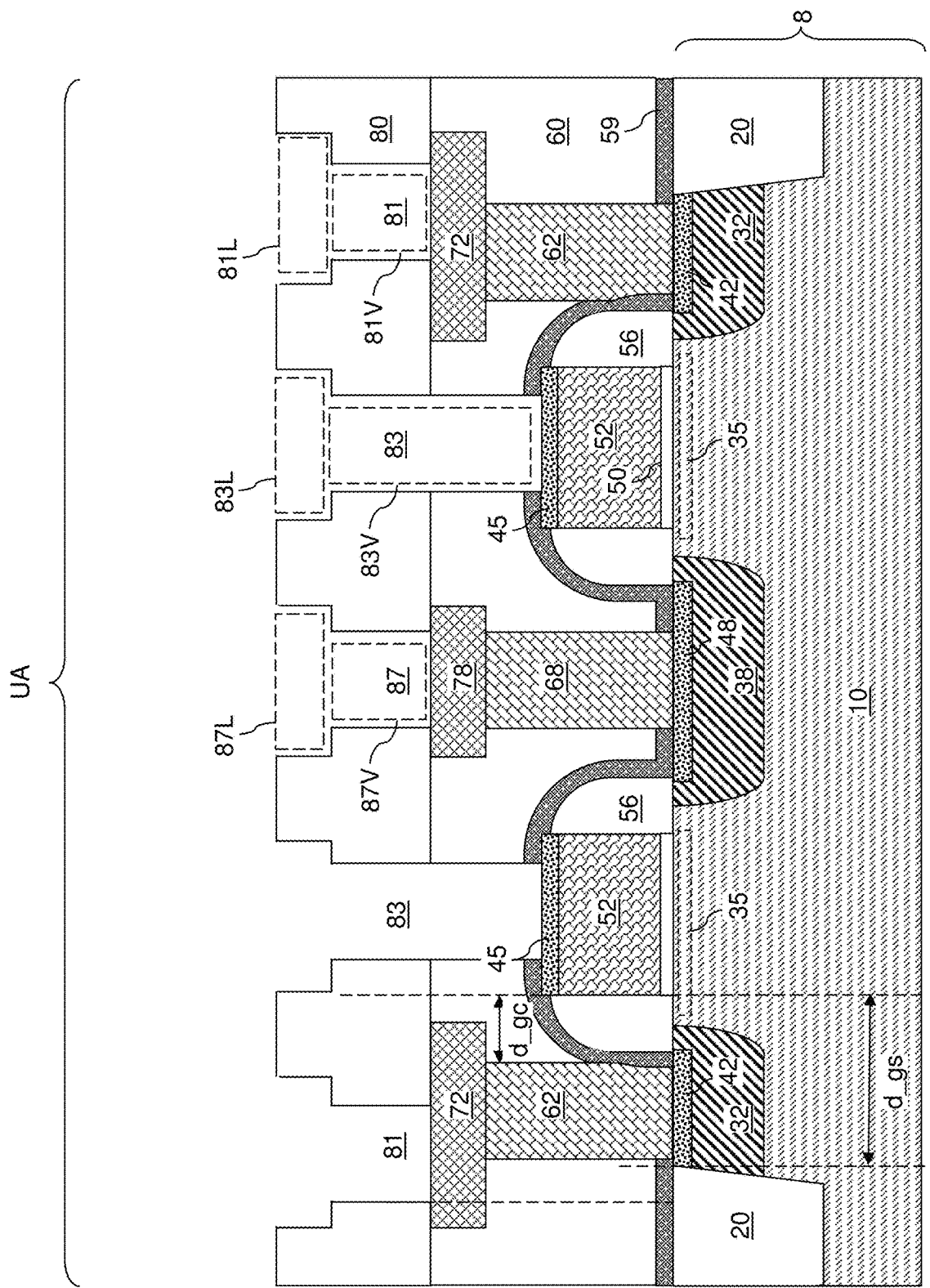

Referring to FIG. 9, integrated line-and-via cavities (81, 87, 83) may be formed through the second dielectric material layer 80. The integrated line-and-via cavities (81, 87, 83) comprise first integrated line-and-via cavities 81 that are formed over a respective first connection line structure 72, second integrated line-and-via cavities 87 that are formed over a respective second connection line structure 78, and gate integrated line-and-via cavities 83 that are formed over a respective gate metal-semiconductor alloy region 45 and/or over a respective gate electrode 52.

Generally, the integrated line-and-via cavities (81, 87, 83) may be formed by employing two lithographic patterning processes and two anisotropic etch processes. For example, a first photoresist layer (not shown) may be applied over the second dielectric material layer 80, and may be lithographically patterned to form a pattern of the discrete line-shaped openings in areas having an overlap with the respective underlying one of the first connection line structure 72, the second connection line structure 78, and the gate metal-semiconductor alloy region 45 (and/or the gate electrodes 52). A first anisotropic etch process can be performed to transfer the pattern of the discrete line-shaped openings into an upper portion of the second dielectric material layer 80. Line cavities (81L, 87L, 83L) can be formed in volumes from which the material of the second dielectric material layer 80 is etched by the first anisotropic etch process. The line cavities (81L, 87L, 83L) comprise first line cavities 81L overlying a respective first connection line structure 72, second line cavities 87L overlying a respective second connection line structure 78, and gate line cavities 83L overlying a respective gate metal-semiconductor alloy region 45. The depth of the line cavities (81L, 87L, 83L) may be in a range from 10% to 60% of the maximum thickness of the second dielectric material layer 80. The first photoresist layer can be removed, for example, by aching.

A second photoresist layer (not shown) may be applied over the second dielectric material layer 80, and may be lithographically patterned to form a pattern of the discrete openings within areas of the line cavities (81L, 87L, 83L). Each discrete opening in the second photoresist layer can be formed in within the area of a respective underlying line cavity (81L, 87L, 83L). A second anisotropic etch process can be performed to transfer the pattern of the discrete openings in the second photoresist layer through the second dielectric material layer 80. Further, the pattern of each opening in the second photoresist layer that overlies a respective gate metal-semiconductor alloy region 45 is transferred through an underlying portion of the first dielectric material layer 60 and through a respective portion of the dielectric liner 59. Connection via cavities (81V, 87V, 83V) are formed underneath the openings in the patterned second photoresist layer. A first connection via cavity 81V can be formed above each first connection line structure 72, a second connection via cavity 87V can be formed above each second connection line structure 78, and a gate connection via cavity 83V can be formed above each gate metal-semiconductor alloy region 45 (and/or above each gate electrode 52). The connection line structures (72, 78) and the gate metal-semiconductor alloy region 45 act as etch stop layers during the etching step. The second photoresist layer can be subsequently removed, for example, by aching.

Each contiguous combination of a first connection via cavity 81V and a first line cavity 81L constitutes a first line-and-via cavity 81. Each continuous combination of a second connection via cavity 87V and a second line cavity 87L constitutes a second line-and-via cavity 87. Each continuous combination of a gate connection via cavity 83V and a gate line cavity 83L constitutes a gate line-and-via cavity 83. A top surface of a first connection line structure 72 can be physically exposed at the bottom of each first line-and-via cavity 81. A top surface of a second connection line structure 78 can be physically exposed at the bottom of each second line-and-via cavity 87. A top surface of a gate metal-semiconductor alloy region 45 (or a gate electrode 52) can be physically exposed at the bottom of each gate line-and-via cavity 83. In one embodiment, the gate line-and-via cavity 83 extends deeper than the first and second line-and-via cavities (81, 87).

Generally, the second dielectric material layer 80 can be formed over the first dielectric material layer 60, the first connection line structures 72, and the second connection line structures 78. A first connection cavity (such as a first line-and-via cavity 81) is formed through the second dielectric material layer 80 over each first connection line structure 72, and a second connection cavity (such as a second line-and-via cavity 87) is formed through the second dielectric material layer 80 over each first connection line structure 78. A gate connection cavity (such as a gate line-and-via cavity 83) is formed through the second dielectric material layer 80, the first dielectric material layer 60, and a portion of the dielectric liner 59 over each gate metal-semiconductor alloy region 45 (and/or each gate electrode 52). Generally, the first connection cavities and the second connection cavities are simultaneously formed by performing at least one anisotropic etch process that simultaneously etches the dielectric material of the second dielectric material layer 80 within the volumes of the first connection cavities and the second connection cavities.

Figure 10:
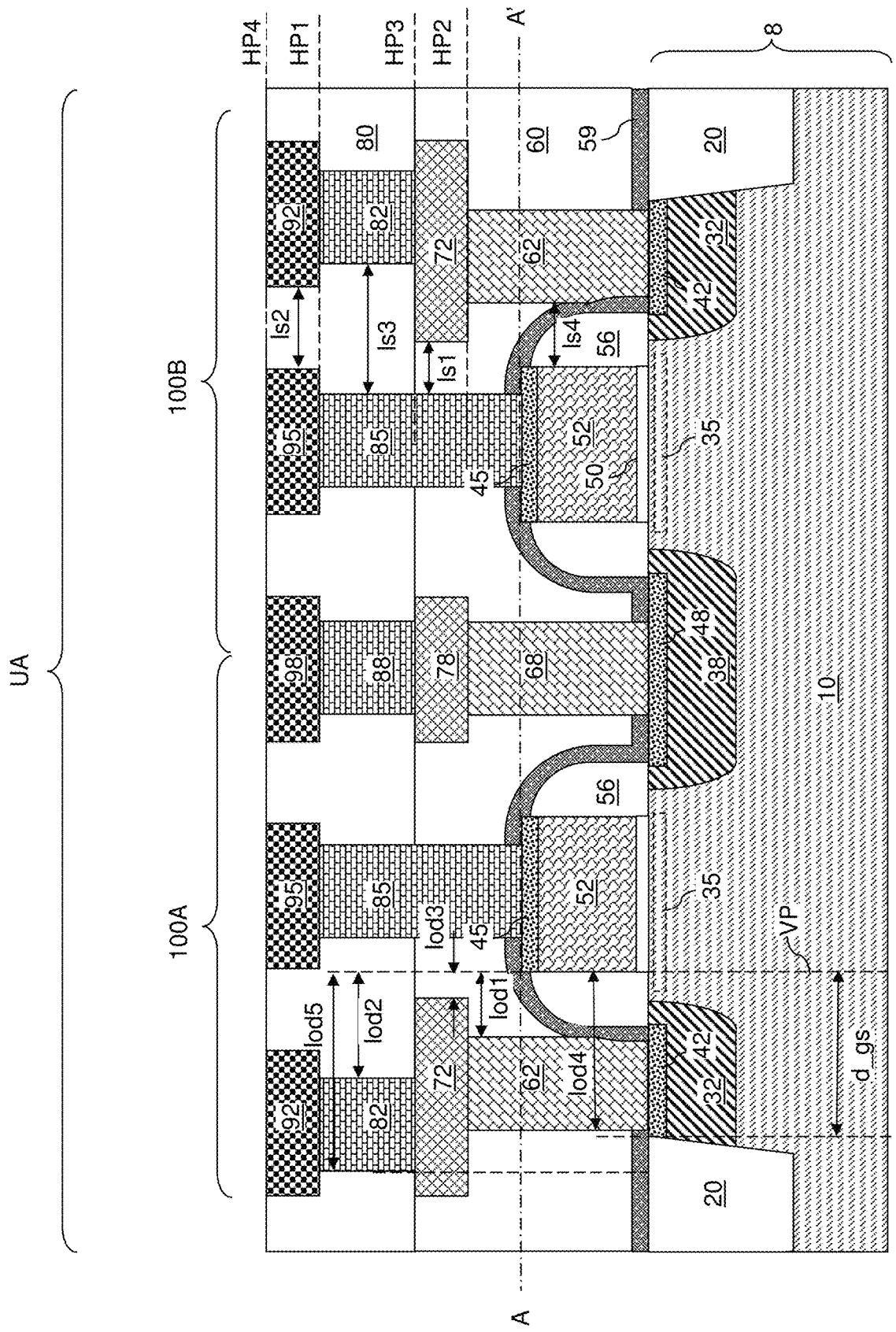

Referring to FIG. 10, the connection cavities (such as the first line-and-via cavities 81, the second line-and-via cavities 87, and the gate line-and-via cavities 83) can be filled with at least one second conductive material, such as at least one metallic material, to form integrated line-and-via structures {(82, 92), (88, 98), (85, 95)}. Each of the integrated line-and-via structures {(82, 92), (88, 98), (85, 95)} comprises a respective connection via structure (82, 88, 85).

The at least one second conductive material may comprise, for example, a metallic barrier liner (not expressly shown) including a conductive metal nitride material and a metallic fill material (not expressly shown), such as a metal. The conductive metal nitride material may comprise titanium nitride, tungsten nitride, tantalum nitride, molybdenum nitride, etc. The thickness of the metallic barrier liner may be in a range from 3 nm to 30 nm, although lesser and greater thicknesses may also be employed. The metallic fill material may comprise tungsten, tantalum, titanium, molybdenum, cobalt, molybdenum, ruthenium, copper, etc.

Excess portions of the at least one metallic material can be removed from above the horizontal plane including the top surface of the second dielectric layer 80 by a planarization process. The planarization process may comprise a chemical mechanical polishing (CMP) process. Each remaining portion of the at least one metallic material filling a respective line-and-via cavity (81, 87) constitutes an integrated line-and-via structure {(82, 92), (88, 98), (85, 95)}. The integrated line-and-via structures {(82, 92), (88, 98), (85, 95)} comprise first integrated line-and-via structures (82, 92) that are formed in the first integrated line-and-via cavities 81, second integrated line-and-via structures (88, 98)} that are formed in the second integrated line-and-via cavities 87, and gate integrated line-and-via structures (85, 95) that are formed in the gate integrated line-and-via cavities.

Each first integrated line-and-via structure (82, 92) comprises a first connection via structure 82 formed in a respective first connection via cavity 81V, and a first metal line 92 formed in a respective first line cavity 81L. Each second integrated line-and-via structure (88, 98) comprises a second connection via structure 88 formed in a respective second connection via cavity 87V, and a second metal line 98 formed in a respective second line cavity 87L. Each gate integrated line-and-via structure (85, 95) comprises a gate connection via structure 85 formed in a respective gate connection via cavity 83V, and a gate metal line 95 formed in a respective gate line cavity 83L.

In some embodiments, the gate line-and-via cavity 83 is formed using separate photolithography and etching steps than the first and second integrated line-and-via cavities (61, 67) which extend to the respective active regions (32, 38). Therefore, the lateral spacing between a gate contact via structure 85 and source/drain contact via structures 62 may be reduced and the minimum lateral spacing based on the capability of a lithographic tool is not imposed between neighboring edges of a gate connection via structure 85 and the source/drain (i.e., first active-region) contact via structure 62. This permits the reduction in width of the transistor.

Generally, each first integrated line-and-via connection via cavity 81 can be filled with at least one second conductive material, and a combination of a first connection via structure 82 and a first metal line 92 is formed in each first integrated line-and-via connection via cavity 81. Further, each second integrated line-and-via connection via cavity 87 can be filled with the at least one second conductive material, and a combination of a second connection via structure 88 and a second metal line 98 is formed in each second integrated line-and-via connection via cavity 87. In addition, each gate integrated line-and-via connection via cavity 83 can be filled with the at least one second conductive material, and a combination of a gate connection via structure 85 and a gate metal line 95 is formed in each gate integrated line-and-via connection via cavity 83.

In one embodiment, each first connection via structure 82 may be formed directly on a top surface of a respective first connection line structure 72. Each second connection via structure 88 may be formed directly on a top surface of a respective second connection line structure 78. Each gate connection via structure 85 can be electrically connected to a respective gate electrode 52 either by contacting a gate metal-semiconductor alloy region 45, or by contacting the respective gate electrode 52 in case gate metal-semiconductor alloy regions are not employed.

According to an aspect of the present disclosure shown in FIG. 10, a transistor 100 (e.g., 100A) comprises a first active region 32 and a second active region 38 separated by a semiconductor channel 35, wherein one of the first active region and the second active region is a source region and another of the first active region and the second active region is a drain region, and a gate stack structure (50, 52) comprising a gate dielectric 50 and a gate electrode 52 overlying the semiconductor channel 35. In one embodiment, the transistor 100 also includes a gate contact via structure 85 overlying and electrically connected to the gate electrode 52 and having a top surface located in a first horizontal plane HP1, a first active-region contact via structure 62 overlying and electrically connected to the first active region 32, and having a top surface located within a second horizontal plane HP2 that underlies the first horizontal plane HP1, a first connection line structure 72 contacting a top surface of the first active-region contact via structure 62, and a first connection via structure 82 contacting a top surface of the first connection line structure 72 and having a top surface within the first horizontal plane HP1.

In one embodiment, the first active-region contact via structure 62 is laterally offset from a vertical plane VP including a proximal sidewall of the gate electrode 52 by a first lateral offset distance lod1, and the first connection via structure 82 is laterally offset from the vertical plane VP by a second lateral offset distance lod2 that is greater than the first lateral offset distance lod1.

In one embodiment, the first connection line structure 72 is laterally offset from the vertical plane VP by a third lateral offset distance lod3; and the third lateral offset distance lod3 is less than the first lateral offset distance lod1. In one embodiment, a surface of the first active-region contact via structure 62 that is most distal from the gate electrode 52 is laterally offset from the vertical plane VP by a fourth lateral offset distance lod4; a surface of the first connection via structure 82 that is most distal from the gate electrode 52 is laterally offset from the vertical plane VP by a fifth lateral offset distance lod5; and the fourth lateral offset distance lod4 is greater than the second lateral offset distance lod2 and is less than the fifth lateral offset distance lod5. However, in alternative embodiments, the device may have other offset distance relationships that do not meet one or more of the above-described lateral offset distance relationships.

In one embodiment, the first connection line structure 72 is laterally spaced from the gate connection via structure 85 by a first lateral spacing ls1. In one embodiment, the first connection via structure 82 is laterally spaced from the gate metal line 95 by a second lateral spacing ls2. In one embodiment, the first connection via structure 82 is laterally spaced from the connection via structure 85 by a third lateral spacing ls3. In one embodiment, the first active-region contact via structure 62 is laterally spaced from the gate electrode 52 by a fourth lateral spacing ls4. In one embodiment, ls1 is smaller than ls3 and/or smaller than ls4. In one embodiment, ls2 is smaller than ls3. However, in alternative embodiments, the device may have other lateral spacing relationships that do not meet one or more of the above-described lateral spacing relationships.

In one embodiment, the first connection via structure 82 may vertically overlap first active-region contact via structure 62 (i.e., there may be a vertical plane that passes through both the first active-region contact via structure 62 and the first connection via structure 82. In one embodiment, the lateral width of the first connection line structure 72 in the source to drain direction may be greater than the lateral width of the first active-region contact via structure 62 in the source to drain direction.

In one embodiment, the transistor 100 comprises a first dielectric material layer 60 having a planar top surface located within a third horizontal plane HP3 that includes the top surface of the first connection line structure 72. In one embodiment, the transistor 100 further comprises a second dielectric material layer 80 overlying the first dielectric material layer 60 and laterally surrounding the first connection via structure 82, and a first metal line 92 embedded within the second dielectric material layer 80 and contacting a top surface of the first connection via structure 82.

In one embodiment, the gate contact via structure 85 comprises a straight sidewall that vertically extends from a periphery of the top surface of the gate contact via structure 85 to a periphery of a bottom surface of the gate contact via structure 85, an upper portion of the straight sidewall of the gate contact via structure 85 contacts the second dielectric material layer 80, and a lower portion of the straight sidewall of the gate contact via structure 85 contacts the first dielectric material layer 60.

In one embodiment, the first connection via structure 82 comprises a first portion having an areal overlap with the first active-region contact via structure 62; and a second portion that does not have an areal overlap with the first active-region contact via structure 62.

In one embodiment, the transistor 100 further comprises a gate metal-semiconductor alloy region 45 in contact with a top surface of the gate electrode 52 and with a bottom surface of the gate contact via structure 85, and a first metal-semiconductor alloy region 42 in contact with a top surface of the first active region 32 and a bottom surface of the first active-region contact via structure 62.

In one embodiment, the transistor 100 also comprises a gate spacer 56 laterally surrounding the gate electrode 52, and a dielectric liner 59 that continuously extends over the gate electrode 52, the gate spacer 56, the first active region 32, and the second active region 38. In one embodiment, the first active-region contact via structure 62 comprises a straight sidewall surface segment that extends straight along a vertical direction or with a taper angle with respect to the vertical direction, and a contoured sidewall surface segment that comprises a non-planar surface segment that contacts a non-planar and tapered surface segment of the dielectric liner 59.

In one embodiment, the transistor 100 also comprises a second active-region contact via structure 68 overlying and electrically connected to the second active region 38, and having a top surface located within the second horizontal plane HP2, a second connection line structure 78 contacting a top surface of the second active-region contact via structure 68, and a second connection via structure 88 contacting a top surface of the second connection line structure 78 and having a top surface within the first horizontal plane HP1. In one embodiment, the dielectric liner 59 comprises a vertically-extending portion laterally surrounding the gate spacer 56 and a horizontally-extending portion adjoined to a bottom periphery of the vertically-extending portion, the first active-region contact via structure 62 contacts a sidewall of the vertically-extending portion of the dielectric liner 59, and the second active-region contact via structure 68 is laterally spaced from the vertically-extending portion of the dielectric liner 59 and extends through the horizontally-extending portion of the dielectric liner 59. The top surfaces of the metal lines (92, 98, 95) and a top surface of the second dielectric material layer 80 can be formed within the same fourth horizontal plane HP4.

The pattern for the first connection line structures 72 and the pattern for the gate connection via structures 85 are formed employing different lithographic steps. As such, the lateral spacing, which is herein referred to as a first lateral spacing ls_1, is not subject to a dimensional limitation based on lithographic constraints, except for variations. In other words, the first lateral spacing ls_1 is not limited by the lithographic processing constraints. Thus, the first lateral spacing ls_1 may be reduced as long as the first lateral spacing ls_1 filled with the dielectric material 60 provides sufficient electrical isolation between neighboring pairs of a first connection line structure 72 and a gate connection via structure 85. As such, the dimension of the first lateral spacing ls_1 may be scaled down without lithographical constraint. This allows lateral scaling of the width of the transistors 100 along the channel direction.

The lateral spacing between neighboring pairs of metal lines (92, 98, 95), which is herein referred to as a second lateral spacing ls_2, may be subject to normal lithographic constraints. In other words, minimum dimension for the second lateral spacing ls_2 is determined by the resolution limit of lithographic images of the lithographic exposure tool that is employed to form the pattern of the metal lines (92, 98, 95) (e.g., that is employed to form the openings that are filled with the metal lines (92, 98, 95).

Thus, two field effect transistors 100 (e.g., 100A and 100B) are formed within the unit area UA. As discussed above, the device structure within a unit area UA may be repeated in a one-dimensional periodic array or in a two-dimensional periodic array. The gate electrodes 52 may extend across plural field effect transistors 100 or may be formed as discrete gate electrodes 52 in each transistor 100.

Figure 11:
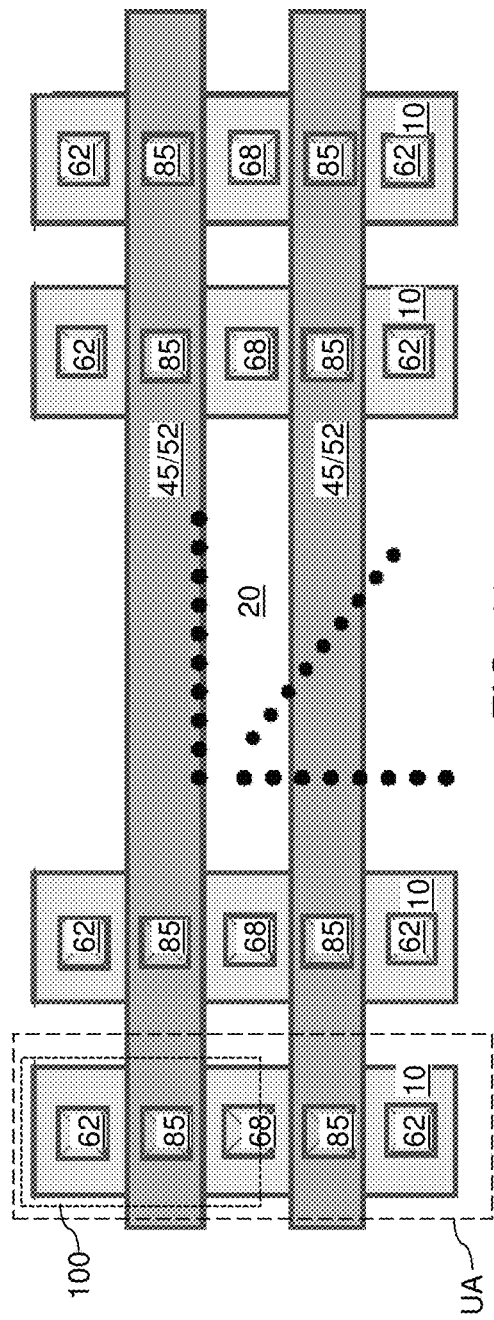
FIG. 11 is a top-down transparent view of an array of transistors from plane A-A' in FIG. 10 according to one embodiment of the present disclosure.

Referring to FIG. 11, a first exemplary configuration of an array of transistors 100 according to an embodiment of the present disclosure is illustrated, in which the gate electrode 52 extends across plural field effect transistors 100 located in the same row.

Figure 12:
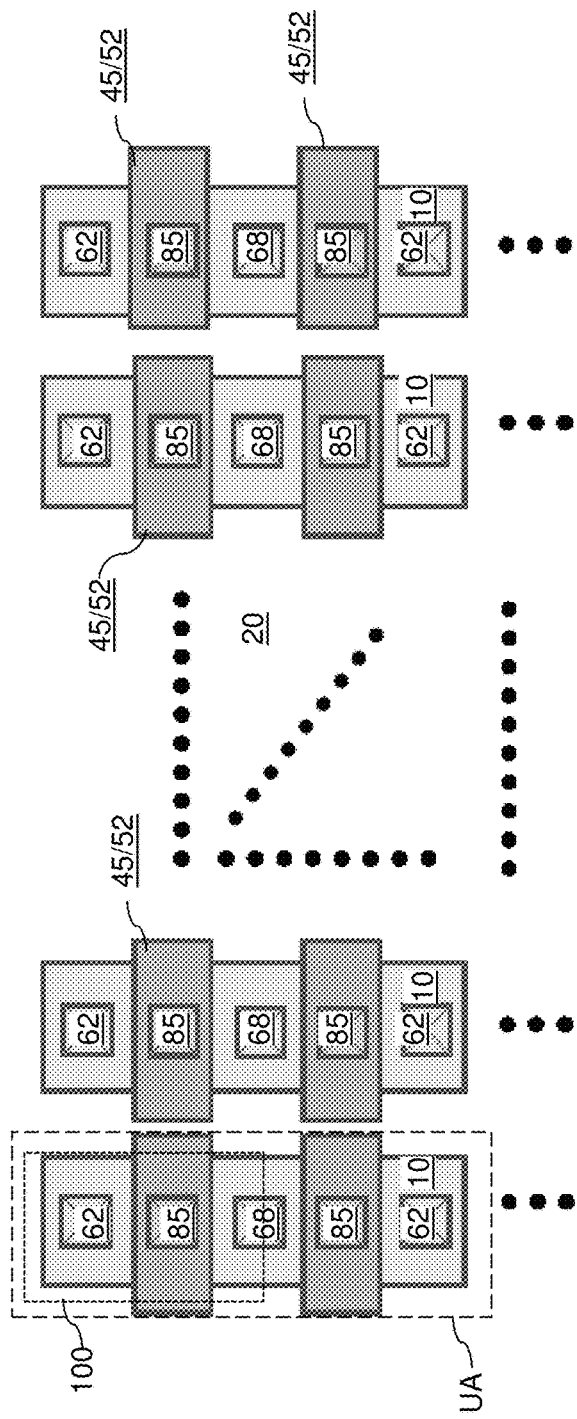
FIG. 12 is a top-down transparent view of an array of transistors from plane A-A' in FIG. 10 according to another embodiment of the present disclosure.

Referring to FIG. 12, a second exemplary configuration of an array of transistors 100 according to an embodiment of the present disclosure is illustrated, in which each transistor 100 contains a discrete gate electrode 52 that does not extend to another transistor 100.

The various embodiments of the present disclosure can be employed to reduce the lateral spacing between a gate electrode 52 and at least a first active-region contact via structure 62. The first active-region contact via structures 62 and the gate connection via structures 85 are patterned employing different lithographic masks and employing different lithographic exposure processes. As such, the lateral spacing between each neighboring pair of a first active-region contact via structure 62 and a gate connection via structure 85 may comprise a sub-lithographic dimension that is not limited by the lithographic resolution limits of the lithographic patterning processes employed to form the patterns of the first active-region contact via structures 62 and the gate connection via structures 85. As such, aggressive scaling of the lateral spacing between each neighboring pair of a first active-region contact via structure 62 and a gate connection via structure 85 can be achieved, and a more compact transistor may be provided by the various embodiments of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A transistor, comprising:
   a first active region and a second active region separated by a semiconductor channel, wherein one of the first active region and the second active region is a source region and another of the first active region and the second active region is a drain region;

a gate stack structure comprising a gate dielectric and a gate electrode overlying the semiconductor channel;

a gate contact via structure overlying and electrically connected to the gate electrode and having a top surface located in a first horizontal plane;

a first active-region contact via structure overlying and electrically connected to the first active region, and having a top surface located within a second horizontal plane that underlies the first horizontal plane;

a first connection line structure contacting a top surface of the first active-region contact via structure; and a first connection via structure contacting a top surface of the first connection line structure and having a top surface within the first horizontal plane;

wherein:

the first active-region contact via structure is laterally offset from a vertical plane including a proximal sidewall of the gate electrode by a first lateral offset distance;

the first connection via structure is laterally offset from the vertical plane by a second lateral offset distance that is greater than the first lateral offset distance;

the first connection line structure is laterally offset from the vertical plane by a third lateral offset distance;

the third lateral offset distance is less than the first lateral offset distance;

a surface of the first active-region contact via structure that is most distal from the gate electrode is laterally offset from the vertical plane by a fourth lateral offset distance;

a surface of the first connection via structure that is most distal from the gate electrode is laterally offset from the vertical plane by a fifth lateral offset distance; and the fourth lateral offset distance is greater than the second lateral offset distance and is less than the fifth lateral offset distance.

2. A transistor, comprising:

a first active region and a second active region separated by a semiconductor channel, wherein one of the first active region and the second active region is a source region and another of the first active region and the second active region is a drain region;

a gate stack structure comprising a gate dielectric and a gate electrode overlying the semiconductor channel;

a gate contact via structure overlying and electrically connected to the gate electrode and having a top surface located in a first horizontal plane;

a first active-region contact via structure overlying and electrically connected to the first active region, and having a top surface located within a second horizontal plane that underlies the first horizontal plane;

a first connection line structure contacting a top surface of the first active-region contact via structure;

a first connection via structure contacting a top surface of the first connection line structure and having a top surface within the first horizontal plane;

a gate metal-semiconductor alloy region in contact with a top surface of the gate electrode and with a bottom surface of the gate contact via structure;

a first metal-semiconductor alloy region in contact with a top surface of the first active region and a bottom surface of the first active-region contact via structure;

a gate spacer laterally surrounding the gate electrode; and a dielectric liner that extends over the gate electrode, the gate spacer, the first active region, and the second active region;

wherein the first active-region contact via structure comprises:

a straight sidewall surface segment that extends straight along a vertical direction or with a taper angle with respect to the vertical direction; and a contoured sidewall surface segment that comprises a non-planar surface segment that contacts a non-planar and tapered surface segment of the dielectric liner.

\* \* \* \* \*